United States Patent [19]
Lancaster

[11] Patent Number: 5,003,361
[45] Date of Patent: Mar. 26, 1991

[54] ACTIVE DYNAMIC MEMORY CELL

[75] Inventor: Loren T. Lancaster, South Whitehall Township, Lehigh County, Pa.

[73] Assignee: AT&T Bell Laboratories, Murray Hill, N.J.

[21] Appl. No.: 366,339

[22] Filed: Jun. 13, 1989

Related U.S. Application Data

[63] Continuation of Ser. No. 91,005, Aug. 31, 1987, abandoned.

[51] Int. Cl.⁵ .................... H01L 29/68; H01L 29/10; H01L 27/02
[52] U.S. Cl. .................... 357/23.6; 357/23.4; 357/41; 357/46; 357/59; 357/51; 357/55
[58] Field of Search .................... 357/23.4, 23.6, 41, 357/46, 59, 55, 51; 365/148, 149, 182, 187; 307/238.1, 238.8, 304

[56] References Cited

U.S. PATENT DOCUMENTS

| Re. 32,090 | 3/1986 | Jaccodine et al. | 357/51 |
|---|---|---|---|
| 4,030,083 | 6/1977 | Boll | 340/173 |
| 4,070,653 | 1/1978 | Rao et al. | 365/222 |
| 4,139,785 | 2/1979 | McElroy . | |
| 4,168,536 | 9/1979 | Joshi et al. | 365/149 |
| 4,224,635 | 9/1980 | Mauthe | 365/149 |
| 4,292,677 | 9/1981 | Boll | 365/222 |
| 4,420,871 | 12/1983 | Scheibe | 357/43 |
| 4,458,259 | 7/1984 | Cogan | 357/55 |
| 4,466,176 | 8/1984 | Temple | 357/23.4 |
| 4,641,165 | 2/1987 | Iizuka et al. | 357/23.6 |
| 4,760,432 | 7/1988 | Stoisick et al. | 357/55 |

FOREIGN PATENT DOCUMENTS

| 55-91860 | 7/1980 | Japan | 357/23.6 |
|---|---|---|---|
| 58-66368 | 4/1983 | Japan | 357/55 |
| 58-184767 | 10/1983 | Japan | 357/55 |
| 61-73365 | 4/1986 | Japan | 357/23.6 |
| 62-51250 | 3/1987 | Japan | 357/23.6 |
| 62-156852 | 7/1987 | Japan | 357/23.6 |
| 62-179145 | 8/1987 | Japan | 357/23.6 |

*Primary Examiner*—Andrew J. James
*Assistant Examiner*—Ngan Van Ngo
*Attorney, Agent, or Firm*—J. H. Fox

[57] ABSTRACT

A dynamic memory cell comprises a storage transistor and an access transistor. The gate of the storage transistor is utilized as storage capacitor electrode, and is connected to its source by a high resistor. The drain of the storage is connected to a source of electrical potential (e.g., $V_{CC}$). The access transistor connects the source of the storage transistor to a bit line. This arrangement multiplies the effective capacitance of the gate storage capacitor, reducing the area required and hence making the structure more compact than a typical inactive (one transistor) DRAM cell. In a preferred embodiment, the resistor is formed to overlie the storage transistor, and the drain of the storage transistor is connected to $V_{CC}$ by means of the sidewall of a trench formed in the semiconductor substrate.

10 Claims, 2 Drawing Sheets

ACTIVE DYNAMIC MEMORY CELL

This application is a continuation of application Ser. No. 091,005, filed on Aug. 31, 1987, now abandoned.

BACKGROUND OF THE INVENTION

1. Field of the Invention

The present invention relates to an integrated circuit having dynamic memory cells.

2. Description of the Prior Art

Dynamic memory cells store a logical "1" or "0" as a high or low voltage level on a capacitor that is accessed by an access transistor. Early generation dynamic memories used a three-transistor cell, but the one-transistor cell is presently considered optimum for purposes of reducing the area required to implement the memory cell on an integrated circuit. Dynamic memories typically utilize refresh circuitry external to the memory cells for periodically restoring the full high or low voltage level in each cell, which may otherwise be lost due to current leakage from the storage capacitor. The use of "self-refreshed" memory cells, which eliminate the need for a separate refresh operation, has also been investigated. Both three-transistor and two-transistor self-refreshed cells have been proposed. For example, U.S. Pat. No. 4,070,653 describes a two-transistor self-refreshed cell, wherein a switchable resistor is switched between a high and low impedance state, depending on whether a logic "1" or "0" is stored. However, the extra space required for the self-refreshing circuitry makes the one-transistor cell the presently preferred choice in commercial practice. With memory densities of one megabit (1M bit) currently in production, and densities of 4M bit and 16M bit under development, the need to conserve the space required for each cell becomes even more important.

The lower limit to the cell size is dictated in part by the size of the capacitor, which must store sufficient electrical charge to allow the information to be reliably read out when required. Current efforts for increasing the density of memory cells are largely directed toward decreasing the area required for the capacitor, without substantially decreasing its capacitance. These efforts include the use of a thinner dielectric layer to separate the capacitor plates, and the use of materials having a higher dielectric constant than those previously used. The use of a vertical capacitor plate (the so-called "trench capacitor") is another technique for saving integrated circuit area. It is also known to locate the capacitor so as to overlie the access transistor, in the so-called "stacked capacitor" cell arrangement.

However, each of these approaches has fabrication difficulties that make it desirable to find improved memory cell designs that conserve integrated circuit area.

SUMMARY OF THE INVENTION

I have invented an integrated circuit dynamic memory cell comprising a storage transistor and an access transistor. The gate electrode of the storage transistor is connected to its source by means of a fixed resistor, with the drain being connected to a source of electrical potential. The access transistor is connected between the source of the storage transistor and information input/output means, typically a bit line conductor. The integrated circuit may include a transistor having its source/drain region connected through the substrate to a power supply voltage by means of a conductive trench sidewall.

DETAILED DESCRIPTION

Figure 1:
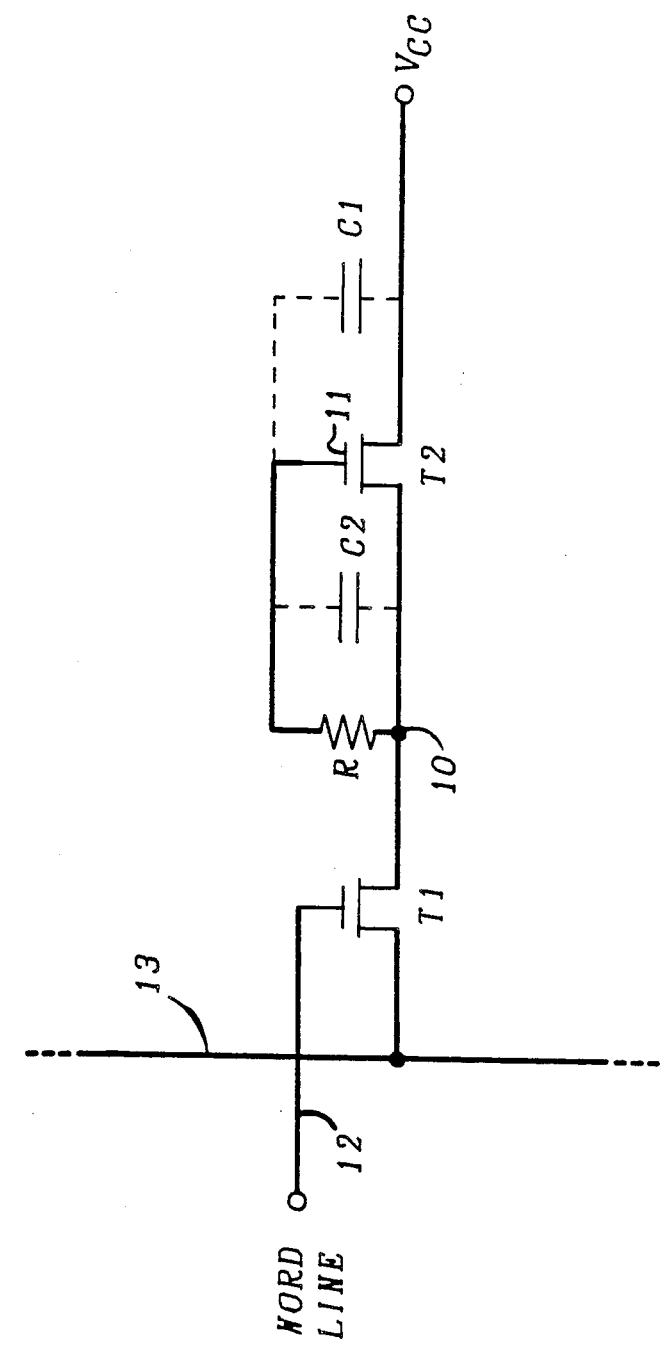
FIG. 1 shows schematically the two transistor memory cell of the present invention.

The following detailed description relates to a dynamic memory cell wherein information is stored in the gate capacitance of a storage transistor, and accessed by means of an access transistor. Referring to FIG. 1, information storage transistor T2 is connected between a source of electrical potential ($V_{CC}$) and a node 10. A resistor R is connected between the gate electrode (11) and the node 10. The information is stored predominantly in the form of charge on the gate electrode (11) of T2. This gate serves as a plate for three storage capacitors: the gate-to-channel capacitance; the gate-to-drain capacitance (C1), and the gate-to-source capacitance (C2). The storage transistor T2 is designed such that $C1 > C2$. The storage transistor serves also to amplify the stored voltage on the gate of T2, thereby providing a signal at node 10 that may be read out through access transistor T1. During a write operation, a voltage supplied through T1 is coupled through resistor R to the gate of T2, and hence to the storage capacitance thereof. Note the presence of a "word line" (12) and a "bit line" (13), which serve the functions of accessing a given row of memory cells, and performing read-/write/refresh operations, respectively, as in a conventional dynamic random access memory design. The inventive cell may thus be used in a memory array having row and column address selection circuitry, input/output circuitry, and sense/refresh circuitry according to designs well known in the art, if desired. Although the inventive memory cell may be implemented in any desired semiconductor technology, an illustrative case suitable for a CMOS integrated circuit will be shown, using nominal 0 and 5 volt ($V_{SS}$, $V_{CC}$) power supply voltage levels.

The operation of the memory cell may be illustrated by considering first a write operation for storing a logical "1" state. Consider that a low voltage level (logical "0") was initially stored in the cell, so that the gate of T2 is at approximately 0 volts, and hence T2 is non-conducting. When a logical "1" is to be written into the cell the bit line is placed at a high voltage level (e.g., 5 volts) by the input circuitry (not shown). A high voltage level is placed on the word line, and thus on the gate of T1, by row selection circuitry (not shown), causing access transistor T1 to conduct. The conduction through T1 then places node 10 at a high level of about 5 volts, assuming a boosted word line potential of $5 + V_{th}$, where $V_{th}$ is the threshold voltage of T1, which is typically about 0.5 to 1.0 volts in current designs. The high level (about 5 volts) at node 10 then places the gate of T2 at this high level, due to conduction through resistor R. The amount of time required to write is determined by the R-C time constant of the resistor R, the output impedance of T1, and the total capacitance on the gate of T2. For example, assuming a total gate capacitance on T2 of 2 femtofarads, the resistor R is typically chosen to have a resistance in the range of 2.5 to 25 megohms.

The logical "1" state is maintained in the cell by bringing the word line (12) low (zero volts), thereby turning off T1. Nodes 10 and 11 will then remain at a high state (5 volts), and the bit line (13) may assume any logic potential without disturbing the logical "1" stored in the cell. The logical "1" stored in the cell remains valid for a period of time, the "hold time", determined primarily by the junction leakage rate on node 10 and the leakage through T1. The hold time is typically designed to be on the order of seconds. Note further that because node 10 is also at a high voltage level (e.g., 5 volts), that resistor R will have nominally 0 volts across it, and hence will not tend to discharge the gate of T2 (node 11). In fact, if a negative-going transient occurs on node 10, for example from an alpha particle, the voltage on the gate of T2 will cause T2 to conduct and recharge node 10 to roughly $5 - V_{th}$ volts, assuming the output impedance of T2 is much less than R.

Consider next the case wherein it is desired to write a logical "0" (i.e., a low voltage state) in the cell. Assume that a logical "1" is stored in the cell prior to the write operation. A low voltage level (e.g., 0 volts) is placed on the bit line by the input circuitry, and a high voltage level on the word line causes access transistor T1 to conduct. The conduction through T1 will pull node 10 down to 0 volts, which in turn causes the gate of T2 to be pulled low through resistor R. Hence, T2 is turned off, and can no longer supply current from $V_{CC}$ to hold node 10 high. This voltage on node 11 represents the logical "0" state, and tends to maintain T2 non-conducting. Note again that there is now 0 volts across resistor R. After the write operation has stored the desired level (either "0" or "1") in the storage transistor, the word line is brought low, turning off access transistor T1.

To perform a read operation, the bit line is precharged to zero volts and allowed to float, the word line is again brought high by the row selection circuitry, and the stored voltage present on node 10 will be supplied through T1 to the bit line. In reading a stored high, T1 temporarily conducts to deliver a positive current pulse to charge the bit line. The output conductance and threshold voltage of T1, and the value of R, are chosen such that the total capacitance on node 11 discharges through R at a rate very much slower than T1 can discharge node 10. Furthermore, the ratio of C1/C2 is selected such that the voltage on node 11 does not strongly capacitively follow the voltage on node 10. Thus, while reading, a stored logical "1", T1 tends to discharge node 10 from 5 volts toward zero volts, the potential on the bit line. During this discharge of node 10, capacitive coupling through C2 and conduction through R will cause the voltage on node 11 to follow that on node 10. However, the values of R and C1/C2 are selected such that the voltage on node 11 falls much more slowly that the voltage on node 10. Once the difference in voltage between nodes 11 and node 10 becomes greater than the threshold of T2 ($V_{th2}$), T2 will start to conduct and charge the bit line through T1. However, this conduction through T2 is transitory, because the conduction causes the potential on the bit line and node 10 to rise. Furthermore, node 11 continues to discharge to node 10 through R. Hence, the potential difference between nodes 11 and 10 becomes again less than $V_{th2}$, and T2 again shuts off. Once T2 stops conducting, node 11 continues to discharge until equilibrium is established among nodes 11, 10 and the bit line. The equilibrium potential is positive with respect to ground, and roughly equal to the amount of charge delivered from the positive current pulse conducted through T2, divided by the capacitance of the bit line.

When reading a stored logical "0", T1 never has an opportunity to conduct. Since the bit line, node 10 and node 11 will all be at ground when T1 is turned on, no current will flow and the bit line potential will remain at zero volts. The bit line voltage thus read may be amplified by a sense amplifier (not shown) and supplied to output circuitry according to techniques known in the art. Even though the present cell is resistant to certain types of charge leakage from the capacitor, a refresh operation is usually required in most applications. For example, when a logic "1" is stored, nodes 10 and 11 are at 5 volts, and both T1 and T2 are non-conducting when the cell is not being accessed. Hence, node 10 and the gate of T2 are floating, with only the gate capacitance of T2 and the junction capacitance of node 10 to hold node 11 at a high voltage state. Then, influences on the cell that supply electrons to node 10, including for example junction leakage, cause node 11 to become less positive. This tends to reduce the magnitude of the positive pulse during a read, and ultimately may result in no pulse being delivered. While leakage is common in conventional dynamic memory cells, the junction leakage in the present cell is isolated to the node 10 junction, there being no storage capacitor junction.

However, periodic refreshing is still desirable for the present inventive cell if the expected interval between write operations is longer than the information hold time. Note that a stored "0" is less susceptible to leakage, since the low level on node 10 can be at the same potential as the doped semiconductor region (e.g., a tub) in which it is formed. Hence, as leakage through T1 and T2 occurs, the increase in potential of node 10 tends to increase the potential of node 11 (by conduction through R), which turns T1 off harder. It is primarily the leakage current through T2 that limits the stored "0" hold time. The refresh operation may be performed using bistable sense/refresh circuitry coupled to the bit lines and periodic activation of the word lines according to techniques known in the DRAM art. The memory cells of the present invention are then provided with a refresh signal applied to the bit lines for restoring a full "0" or "1" voltage level to the cells. For this purpose, means are provided, typically on the same integrated circuit as the memory cells, for periodically sensing the information stored in each cell and placing a full refresh voltage level on the bit line associated with each cell. By simultaneously accessing a cell, the refresh voltage is thereby stored in the storage transistor of the cell.

The bit line is desirably precharged to a low voltage state between cell access operations, when n-channel access and storage transistors are used (and to a high voltage state if p-channel transistors are used). This provides for maximum signal transfer to the bit line when reading a stored high signal, while also allowing for reading a stored low signal. However, a precharge level above ground but less than the positive power supply voltage level (e.g., $V_{CC}/2$) is also possible. To read out a signal from a precharged low bit line, a single-ended sense amplifier as known in the art may be employed. For example, a complementary inverter may be used, wherein p-channel and n-channel transistors have their channel current paths serially connected. It is desirable for the threshold of the n-channel transistor ($V_{tn}$) to be less than that of the p-channel transistor ($V_{tp}$), in order to obtain maximum sensitivity. A threshold difference may in effect be obtained by placing diode-connected (i.e., gate connected to drain) p-channel transistors between the positive voltage supply and the inverter. It is alternately possible to use a differential sense amplifier, with differential inputs being connected to adjacent bit lines. Alternately, one input may be connected to the desired bit line, and the other input connected to $V_{CC}/2$ reference potential. In that case, a $V_{CC}/2$ precharge is desirable.

Figure 2:
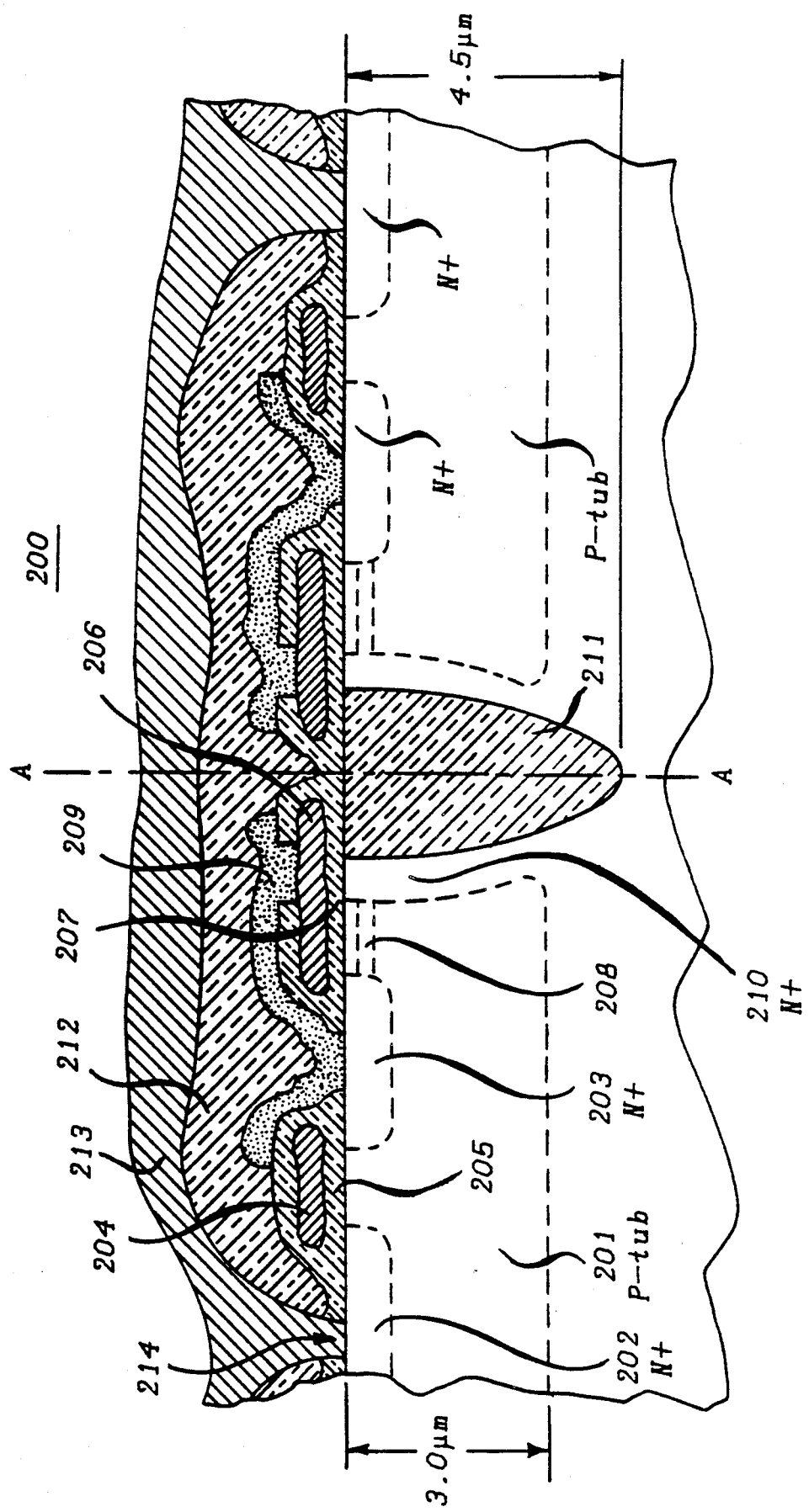
FIG. 2 shows a cross section of an exemplary embodiment of the inventive memory cell.

The present invention may be implemented with any desired layout and component technology, and any desired semiconductor material. The following example in metal oxide silicon (MOS) technology is applicable for both NMOS and CMOS technology, and also for PMOS technology with the reversal of conductivity types shown. FIG. 2 illustrates in cross section an exemplary implementation, wherein two adjacent cells are located along a common bit line. For clarity of explanation, the left-hand cell as viewed will be described herein, with comparable regions being formed in mirror-image for the right-hand cell, as reflected across line A—A. An n-type semiconductor wafer, or epitaxial layer thereon, serves as a substrate 200, and is connected to the positive power supply ($V_{CC}$). A p-tub region 201 is formed in the substrate. An n+ region 202 serves as the source for access transistor T1, and n+ region 203 serves as both the drain for T1 and also as the source for storage transistor T2. A gate electrode 204, typically doped polysilicon that may include an overlying metal silicide layer, is insulated from the channel region of T1 by gate insulator region 205, typically silicon dioxide. The gate 206 and gate insulator 207 of storage transistor T2 may be formed of the same materials and at the same time as those for T1 if desired. Underneath the gate insulator of T2 is an optional threshold adjust implant region 208, being typically a p-type implant in the p-tub that serves to increase the threshold voltage of T2. The resistor R is formed of a deposited doped polysilicon region 209 that connects the gate electrode 206 and the drain region 203 of T1. Other resistor materials, for example a doped glass or a ceramic, may be used. By forming the resistor to overlie the storage transistor, substrate area is conserved.

Another space-saving feature of the embodiment of FIG. 2 is the use of a vertical n+ doped region 210 that serves as the drain of T2 and connects it electrically to the substrate 200, which is at $V_{CC}$ potential, as noted above. The doped region 210 is formed in the sidewall of trench 211 that is etched in the substrate prior to the formation of the overlying layers according to techniques known in the art. The doping of the sidewall likewise may be accomplished by known techniques. The trench is typically filled with doped polysilicon or oxide, to provide a planar surface for the overlying layers. The structure described is covered with a dielectric layer 212, typically a flowable glass. A conductive layer 213, typically aluminum or a refractory metal, contacts the source region 202 of the access transistor T1 via a contact window 214. Conductor 213 serves as the bit line to interconnect the access transistors located in a given column of memory cells.

Numerous other implementations are possible. For example, the access transistor and the storage transistor of a given cell may be stacked vertically, in order to further conserve space. Alternately, one or both of the transistors in a cell may be located vertically in the wall of a trench or mesa structure, with still other configurations being possible. The memory cell of the present invention may be used in a dedicated stand-alone integrated circuit, or included with logic circuitry (e.g., as a cache memory) on an integrated circuit chip or wafer, in the case of wafer scale integration. Although a plurality of memory cells arrayed in rows and columns are usually provided in a given integrated circuit, the organization is optional insofar as the present invention is concerned.

What is claimed is:

1. An integrated circuit formed in a semiconductor substrate having a broad top surface and being of a given conductivity type and comprising at least one memory cell, a first conductor for providing an access voltage to said cell, and a second conductor for writing information into said cell and reading information from said cell, characterized in that said cell comprises:

a storage transistor having its drain connected to a power supply voltage means, and a gate electrode connected to its source by means of a fixed resistor; and an access transistor having its drain connected to the source of said storage transistor, its gate connected to said first conductor, and its source connected to said second conductor, wherein said storage transistor is located in a doped region that is formed to a given depth in said substrate, and with said doped region that is formed to a given depth in said substrate, and with said doped region having the opposite conductivity type as said substrate;

wherein the drain of said storage transistor is connected to said power supply voltage means by means of a doped conductive region formed in a sidewall that extends from the surface of said substrate to below the depth of said doped region.

2. The integrated circuit of claim 1 wherein the source of said storage transistor and the drain of said access transistor are the same semiconductor region.

3. The integrated circuit of claim 1 wherein said fixed resistor comprises a deposited material overlying a semiconductor substrate.

4. The integrated circuit of claim 1 wherein said resistor has a value of at least 2.5 megohms.

5. An integrated circuit, including a semiconductor substrate region having a broad top surface and being of a given conductivity type, and having a doped region of the opposite conductivity type located therein, wherein said doped region includes at least one transistor formed in said broad top surface and having a source/drain region of said given conductivity type, characterized in that a trench having a vertical sidewall is located in said substrate, and said source/drain region is electrically connected to the substrate region by means of a highly conductive doped region located in the sidewall of said trench, wherein said source/drain region is connected to a power supply voltage conductor.

6. The integrated circuit of claim 5 wherein said substrate region is connected to a positive power supply voltage (e.g. $V_{CC}$) conductor.

7. An integrated circuit comprising:

a semiconductor substrate having a broad top surface and being of a given conductivity type, and having a doped tub region of the opposite conductivity type formed therein; and at least first and second transistors in said tub region having source/drain regions of said given conductivity type formed in said broad top surface;

characterized in that a trench having opposed vertical sidewalls is located in said tub region, and a source/drain region of said first transistor and a source/drain region of said second transistor are electrically connected to the semiconductor substrate by means of highly conductive doped regions formed in opposite sidewalls of said trench, wherein said source/drain regions are connected to a power supply voltage conductor.

8. The integrated circuit of claim 7 wherein said given conductivity type is p-type, said opposite conductivity type is n-type, and said power supply voltage conductor is a positive power supply voltage conductor.

9. The integrated circuit of claim 7 wherein said trench is filled with a material that provides a planar surface for overlying layers of said integrated circuit.

10. The integrated circuit of claim 9 wherein said material is selected from the group consisting of doped polysilicon and an oxide.

* * * * *